United States Patent
Dettmers et al.

(10) Patent No.: US 7,489,216 B2
(45) Date of Patent: Feb. 10, 2009

(54) HOUSING COVER FOR SWITCHING SOLENOID HOUSING

(75) Inventors: Michael Dettmers, Kamen (DE); Sebastian M. Mundry, Luedinghausen (DE); Jens Titschert, Luenen (DE); Ulrich Ballauf, Wuppertal (DE)

(73) Assignee: DBT GmbH (DE)

( * ) Notice: Subject to any disclaimer, the term of this patent is extended or adjusted under 35 U.S.C. 154(b) by 105 days.

(21) Appl. No.: 11/583,615

(22) Filed: Oct. 19, 2006

(65) Prior Publication Data

US 2007/0109083 A1 May 17, 2007

(30) Foreign Application Priority Data

Oct. 19, 2005 (DE) .................. 20 2005 016 473 U

(51) Int. Cl.
*H01H 9/02* (2006.01)
*H01H 67/02* (2006.01)

(52) U.S. Cl. ....................... 335/202; 335/132
(58) Field of Classification Search ................ 335/202; 137/454.5, 454.2
See application file for complete search history.

(56) References Cited

U.S. PATENT DOCUMENTS

| | | | | |
|---|---|---|---|---|
| 3,775,714 A | * | 11/1973 | Heuer ......................... | 335/230 |
| 4,150,686 A | * | 4/1979 | El Sherif et al. ............ | 137/377 |
| 4,835,426 A | * | 5/1989 | Henville ....................... | 310/23 |
| 4,852,852 A | * | 8/1989 | Krieger et al. ................. | 251/78 |
| 5,055,813 A | * | 10/1991 | Johnson ....................... | 335/284 |
| 5,303,807 A | * | 4/1994 | Domeneghini ............ | 192/103 F |
| 5,339,777 A | * | 8/1994 | Cannon ................... | 123/90.12 |
| 6,098,653 A | * | 8/2000 | Kobow et al. ............ | 137/454.5 |
| 6,204,460 B1 | * | 3/2001 | Hojo et al. ................ | 200/302.2 |
| 6,323,747 B1 | * | 11/2001 | Mader et al. ................... | 335/80 |
| 6,616,122 B2 | * | 9/2003 | Kobow et al. .......... | 251/129.18 |
| 6,779,776 B2 | * | 8/2004 | Suilmann et al. ....... | 251/129.18 |
| 2003/0030525 A1 | * | 2/2003 | Sato et al. .................... | 335/256 |

FOREIGN PATENT DOCUMENTS

DE            201 04 677 U1     3/2001

* cited by examiner

*Primary Examiner*—Elvin G Enad
*Assistant Examiner*—Alexander Talpalatskiy
(74) *Attorney, Agent, or Firm*—Baker & McKenzie LLP

(57) ABSTRACT

A housing cover for a solenoid housing operable for accommodating solenoids for switching hydraulic directional valves is disclosed. A housing cover box has a plurality of side walls, a top side, and an open bottom side, with first and second actuating guides for guiding first and second solenoid control push rods being located on the top side. A plug connector is located between the actuating guides. At least one screw clearance hole is located at each corner of the housing cover box for locating a screw for joining the housing cover box to the solenoid housing. A sealing plate is located between the housing cover box and the solenoid housing, and at least one mounting foot is located at a corner and on a bottom surface of the housing cover box. A tubular spigot is aligned with and extends each screw clearance hole.

14 Claims, 2 Drawing Sheets

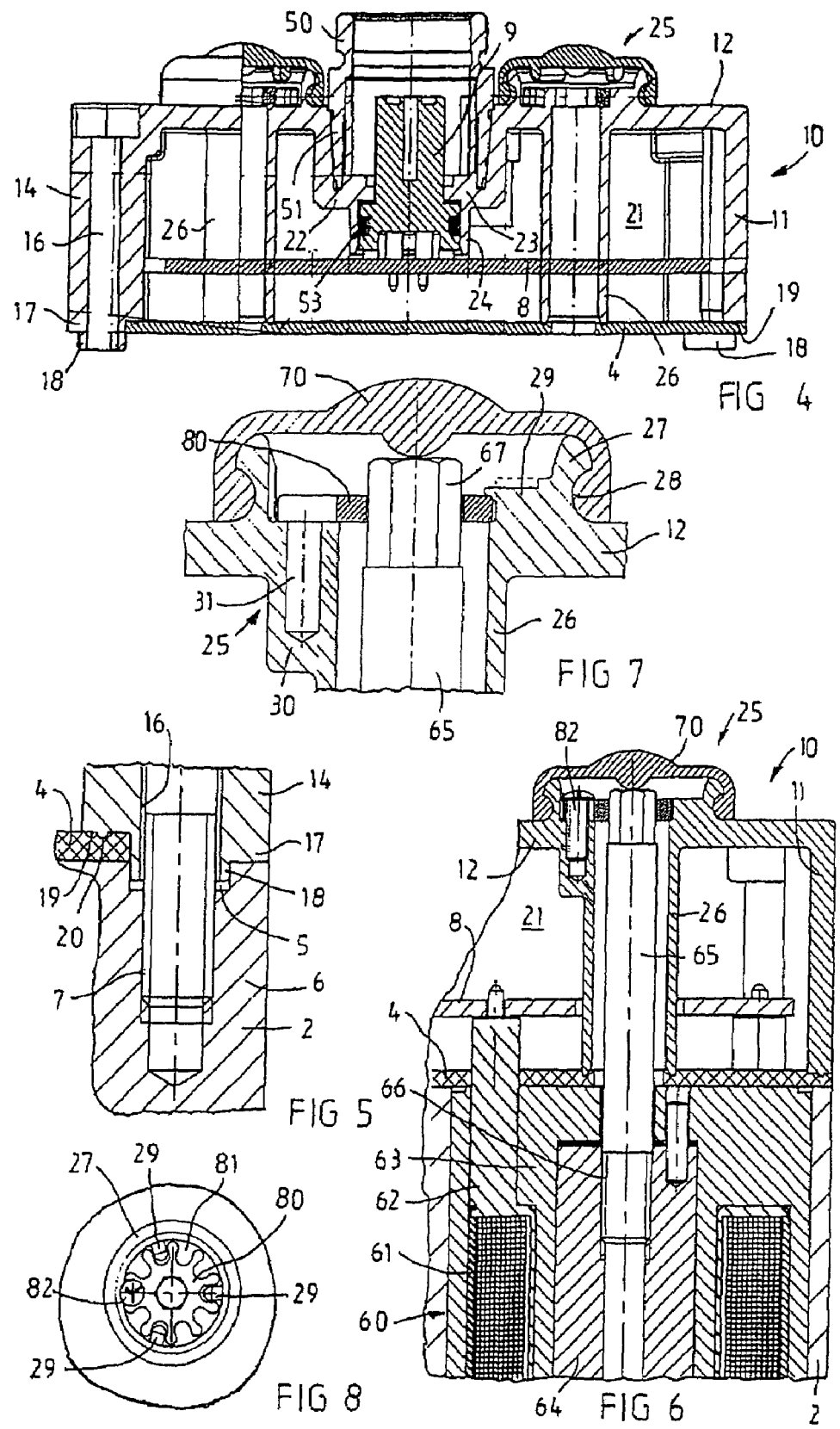

HOUSING COVER FOR SWITCHING SOLENOID HOUSING

CROSS-REFERENCE TO RELATED APPLICATIONS

This application claims priority from German patent application No. 20 2005 016 473.9, filed on Oct. 19, 2005.

BACKGROUND OF THE INVENTION

The invention relates to a housing cover for a switching solenoid housing, which accommodates solenoids for switching electrohydraulic valves, in particular as used in underground mining, with a housing cover box, which is open at a bottom side and is made from a plastic injection molded part with closed sidewalls and a top side that is integrally connected to these, in the interior of which a printed circuit board can be or is arranged, with two actuating guides on the top side for a manual operation of solenoid control push rods, with a plug connector arranged centrally between the two actuating guides, and with screw clearance holes in the corners of the housing cover box for fixing screws for joining the housing cover to the switching solenoid housing while interposing a sealing plate.

A double multi-way solenoid valve intended for use in underground mining with a switching solenoid housing with two solenoids arranged in the housing and a housing cover that can be releasably fixed to the switching solenoid housing while interposing a sealing plate is known from DE 196 46 611C1 and has been successfully marketed by the applicant for years. The housing cover used with the switching solenoid housing constitutes a special fabrication for the double 3/2-way solenoid pilot valves that are overridingly used in underground mining. Particularly when using a solenoid valve fitted with a releasable housing cover in underground mining, the environmental influences such as moisture, fine carbon dust etc. must be reliably prevented from entering the interior of the switching solenoid housing or the housing cover, as this could lead to malfunctions.

DE 201 04 677 discloses the assignment to the solenoid control push rod of an adjustment disk, which is arranged in the switching solenoid housing underneath the sealing plate and enables the solenoid switching stroke to be adjusted. For the purposes of adjusting the control push rod switching stroke, the control push rod is connected to an armature arranged within the windings by means of a screw connection, the adjustment of which enables the relative position between control push rod and armature, and therefore the switching stroke, to be changed.

BRIEF SUMMARY OF THE INVENTION

The object of the invention is to create a housing cover, which is easy to manufacture, which enables reliable sealing of the separating joint with the switching solenoid housing, and which, furthermore, by design can be easily fitted with different sockets or plug connectors.

According to the invention, this and other problems are solved in that the bottom side is provided in the corners with mounting feet formed integrally on the housing cover box, which are each provided with a tubular spigot, which extends the screw clearance hole, and between which are arranged set-back boundary edges of the sidewalls, which form clamping edges for the sealing plate. With the housing cover according to the invention, the tubular spigots located before the mounting feet cause the housing cover to be centered and accurately positioned on the switching solenoid housing before the fixing screws are tightened. At the same time, the mounting feet and the set-back boundary edges of the sidewalls enable the sealing plate to be accurately fitted and in no case be compressed too strongly in one edge zone, as the size of the set-back section of the boundary edges relative to the bottomsides of the mounting feet produces a minimum gap in each case, which remains as a free space for the interposing of the sealing plate even at maximum tightening torque of the fixing screws.

According to a preferred embodiment, the sealing effect of the sealing plate can be increased in that the boundary edges, which are set back compared with the mounting feet and which form the bottomside of the housing cover box in the area of the sidewalls, are provided with a peripheral sealing rib, which effects an additional compression of the sealing plate at the peripheral edge and, at the same time, serves as an additional barrier against a penetration of moisture. Here, the height of the sealing rib is preferably chosen to be somewhat less than the thickness of the mounting feet in order to prevent excessive compressions of the sealing plate at its edge.

According to a particularly preferred embodiment, a double-walled mounting with an annular gap for anchoring an anchoring section of a threaded bush is cast onto the top side, wherein more preferably a ring-shaped collar is connected to the rear of the mounting base of the mounting. This embodiment has the further advantages that different threaded bushes can be anchored to the housing cover for different connecting threads of connecting plugs or the like, and also that, at the same time, the ring-shaped collar enables an appropriate plug section to press against the printed circuit board at the rear and thus inside the housing cover with a suitable seal, such as for example a sealing ring sealing against the inner circumference of the ring-shaped collar. Different threaded bushes and/or different plug sections on the printed circuit board can then be fixed to a switching solenoid housing with one and the same housing cover enabling a standard housing cover to be fitted with almost all plug systems available on the market for underground mining. The threaded bush can be glued in the annular gap or anchored in another way. In a preferred embodiment, the anchoring section of the threaded bush is already cast into the top side when the housing cover is injection molded. The anchoring of the anchoring section of a threaded bush in an annular gap of a mounting, which is preferably double-walled and designed in the form of a depression, is of independent inventive significance.

According to a further advantageous embodiment, likewise of independent inventive significance, an adjustment disk for adjusting a control push rod switching stroke, which is accessible from the top side, consequently from the outside and thus when the housing cover is fitted, is arranged in or by each control push rod actuating guide. It is particularly advantageous if, for each adjustment disk, at least one projection, which engages in a locking recess in the adjustment disk, is formed on the top side, which enables the set adjustment of the control push rod switching stroke to be fixed. In order to then securely anchor the adjustment disk in the selected adjustment, it is particularly advantageous if the projection is initially longer than the thickness of the adjustment disk. This enables a positive and/or bonded fixing of the adjustment disk to be achieved by reshaping the projection with the action of heat, for example with a soldering iron or similar, after adjusting the control push rod switching stroke.

More preferably, each control push rod actuating guide can have a ring-shaped extension on the top side with a peripheral indentation for fixing an elastic hood. By means of the elastic hood, each solenoid can also be operated manually in emergency situations. At the same time, the elastic hoods can be easily anchored or released by positively engaging with the indentation from behind without additional measures or additional fixing means being required for this. More preferably, a tapped hole for a locking screw for the adjustment disk can be formed in the bottom of each control push rod actuating guide within the ring-shaped extension. The locking screw need only be used if readjustment after a repair or the like was necessary and all the projections previously melted by the effect of heat have become unusable. The tapped holes, which are formed right at the injection molding process stage, can of course also be used if no projections are provided.

It is more advantageous if both control push rod actuating guides are provided with cast-on tubular pieces extending from the top side to the bottom side, which each form sealed casings for the control push rods. The abovementioned tapped holes can then advantageously be cast in the sides of the tubular pieces at the same time. The tubular pieces, which form a casing for the control push rods, enable the interior of the housing cover to be filled with potting compound in order to form an additional seal and encapsulation of the printed circuit board. In order to be able to carry out the potting, it is particularly advantageous if the top side is provided with filling openings for potting compound. When at least two filling openings are provided, one of the openings can be used for pouring in the potting compound and the other as a ventilation opening.

In underground mining, it is desirable that the switching state of each solenoid be indicated directly at the solenoid. In order to simplify the indication, it is more advantageous if at least one fiber-optic rod is cast on in the top side, one end of which passes through and is anchored in the top side, and the other end of which extends down to the position of the printed circuit board. As two solenoids are usually arranged in the switching solenoid housing, it is particularly expedient if two fiber-optic rods, which work together with LEDs on the printed circuit board, are cast in in order to be able to indicate the switching state of the two solenoids independently from one another. The fiber-optic rods have the particular advantage that even filling the interior with potting compound does not prevent the switching state from being indicated, as the length of the fiber-optic rods and the positioning of the LEDs on the printed circuit board can be exactly matched to one another so that it can be ensured that the indication of the LEDs is guided into the fiber-optic rods before the potting compound is poured in.

BRIEF DESCRIPTION OF THE SEVERAL VIEWS OF THE DRAWINGS

Further advantages and embodiments of a multi-way solenoid valve with housing cover according to the invention can be seen from the following description of an exemplary embodiment shown schematically in the drawing. In the drawing:

FIG. 4 shows a sectional view along IV-IV in FIG. 3;

FIG. 5 shows the fixing and centering of the housing cover on the switching solenoid housing in sectional view through one corner;

FIG. 6 shows a vertical section through housing cover and solenoid housing in the area of one solenoid;

FIG. 7 shows a detailed view of the control push rod actuating guide in the top side of the housing cover box; and FIG. 8 shows a locked adjustment disk in plan view on the control push rod actuating guide with the hood removed.

DETAILED DESCRIPTION OF THE INVENTION

Figure 1:
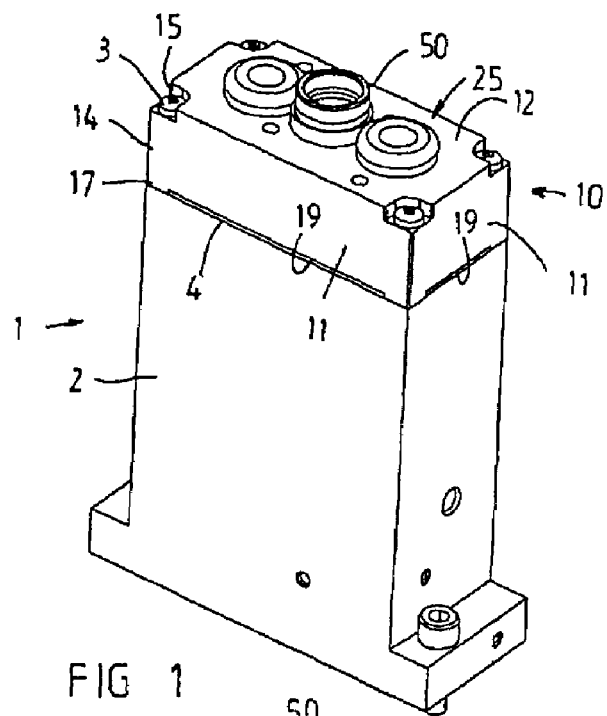
FIG. 1 shows a switching solenoid housing with fitted housing cover in perspective.
Figure 2:
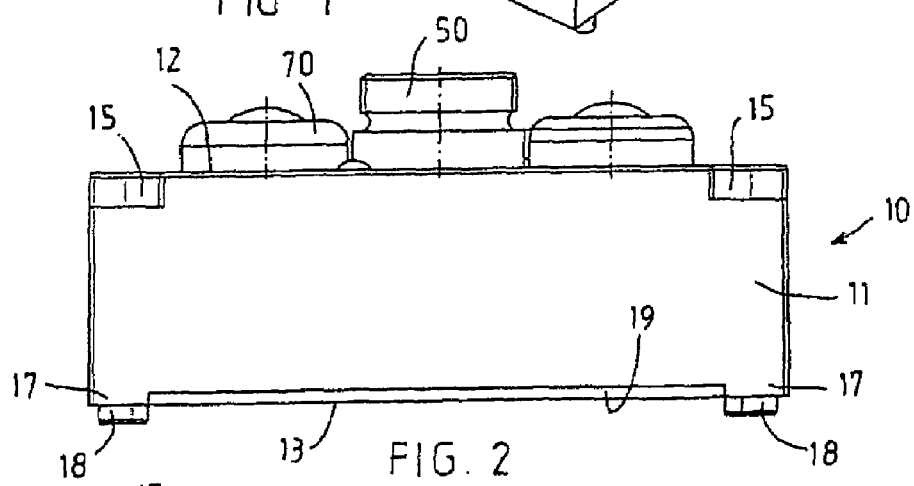
FIG. 2 shows a housing cover according to the invention in side view.

A double 3/2-way solenoid pilot valve is shown in FIG. 1 with the overall reference 1, which comprises a switching solenoid housing 2, accommodating the solenoid inserts and the pilot valve inserts for hydraulic directional valves that can in particular be used in underground mining, and a housing cover 10 that is releasable and screwed in a fixed manner to the end face of the switching solenoid housing 2. Here, two solenoids with two pilot valve inserts are arranged in the solenoid housing 2 of the valve 1, from which the term double multi-way solenoid pilot valve is derived. The construction of the housing cover 10 is explained below with reference also to FIGS. 2 to 8.

The housing cover 10 consists of an injection molded part made from a suitable plastic with sidewalls 11 at right angles to one another and a top side 12 integrally connected to these. The housing cover 10, which is designed as a housing cover box, is only open at the bottom side 13. The releasable screw fixing of the housing cover 10 to the switching solenoid housing 2 is achieved by means of four fixing screws 3 arranged in its four corners 14 and with their heads lying in depressions 15 in the top side 12. The screw shaft of each fixing screw 3 passes through in each case one hollow screw clearance hole 16 arranged in the relatively solidly constructed corner 14. On the bottom side 13, cast on in each corner 14 of the housing cover 10, is a mounting foot 17 with an essentially square base area, to which is connected a likewise cast-on tubular spigot 18 as an extension of each screw clearance hole 16. The mounting feet 17 with the square base area and cross section have the effect that a set-back boundary edge 19 on each sidewall 11 is formed between two mounting feet 17.

In the assembled state of the housing cover 10 on the switching solenoid housing 2, as FIGS. 4 to 6 particularly show, a sealing plate 4 can then be arranged between the housing cover 10 and the switching solenoid housing 2 in such a way that the sealing plate 4 is compressed by a predetermined amount on each edge. Here, the amount of compression depends on the initial thickness of the sealing plate 4 and the depth of the mounting foot 17 relative to the set-back boundary edge 19. The sealing clamping of the sealing plate 4 at its edges to the respective boundary edges 19 which form clamping edges for these, is improved according to the invention in that all set-back boundary edges 19 are provided with a peripheral sealing rib 20 already formed during the manufacturing process of the housing cover 10. At the same time, the clamping of the sealing plate 4 and its positioning are improved by the tubular spigots 18, because as FIG. 5 especially shows, these are engaged and centered in appropriately arranged and preferably precisely fitting stepped depressions 5 in the corners 6 of the peripheral wall of the metal switching solenoid housing 2. Due to the interaction between the tubular spigots 18, which are designed in line with the screw clearance holes 16 in the housing cover 10, and the stepped depressions 5, which are designed in line with the threaded holes 7 into which the fixing screws 3 are screwed, an exact centering and positioning of the housing cover 10 relative to the switching solenoid housing 2 can consequently be achieved.

In the exemplary embodiment shown, a printed circuit board 8 shown in FIGS. 4 and 6, to which an electrical contact plug 9 is soldered, which meets the requirements and wishes of the respective mine operator, is arranged in the interior 21 of the housing cover box consisting of an injection molded part and forming the housing cover 10. A double-walled mounting 22, the mounting base 23 of which is set back in the interior 21, is formed centrally on the top side 12 of the housing cover 10 for connecting a connecting cable (not shown) to the contact plug 9 connected to the printed circuit board 8. Between the two protruding wall sections of the mounting 22, an anchoring section 51 holds a brass threaded bush 50, which is glued in the annular gap of the mounting, or preferably is already cast in at this point during the manufacturing process of the housing cover 10. The annular gap and the anchoring section can each have a conical cross section opening outwards towards the top side 12. On the rear of the base 23 of the mounting 22 is connected a ring-shaped plastic collar 24, against the inner circumference of which a section of shaft of the contact plug 9 is sealed by interposing an O-ring 53. Here, the electrical contacts of the contact plug 9 protrude through a hole in the center of the mounting base 23 of the mounting 22. The threaded bush 50 can be designed in accordance with the specifications required by the customer, and different threaded bushes 50 can be fixed to or mounted on the housing cover 10.

As already explained above, two solenoids 60, of which only one is shown in FIG. 6, are arranged in the switching solenoid housing 2 of the double solenoid valve 1. Each solenoid 60 has a cylindrical coil body 61 to which current can be applied and which is connected to the printed circuit board 8 by means of a connecting piece 62, and is arranged in a magnetizable iron core 63. Arranged in the iron core 63 so that it can slide while being guided longitudinally, is an armature 64 into which a control push rod 65 is screwed, which can be adjusted by means of a screw connector 66 as is disclosed in detail in DE 201 04 677 U1 to which reference is made in this regard. The control push rod 65, the position of which can be changed by energizing the coil body 61, protrudes with its top control push rod end through the housing cover 10 as far as the top side 12. For this purpose, the housing cover 10 is provided with two control push rod actuating guides 25 for each control push rod 65, which on the one hand have tubular pieces 26 extending integrally from the top side 12 to the bottom side, and, on the other, incorporate ring-shaped extensions 27 formed on the top side 12 with a peripheral indentation 28 to which an elastic hood 70 can be fixed by snapping into place. The elastic hoods 70 enable each control push rod 65 to be operated manually. At the same time, they seal each control push rod actuating guide 25 against the ingress of moisture.

An adjustment disk 80, which sits rotationally fixed on a multi-sided section 67 at the end of the control push rod 65, is arranged within the ring-shaped extension 27 of the control push rod actuating guide 25, and is accessible from the top side 12 with the hood 70 removed. The switching stroke of each solenoid 60 can be adjusted and fixed in the factory by means of the adjustment disk 80. To adjust the switching stroke, the position of the control push rod 65 is changed relative to the armature 64 by means of the screw-in thread 66. As FIG. 8 particularly shows, the adjustment disk 80 can have a multiplicity of tooth-shaped indentations 81 on the external circumference, the factory-set position of the adjustment disk 80 being fixed by means of projections 29 integrally formed on the top side 12 within the collar-shaped extensions 27. As FIGS. 7 and 8 show, the adjustment disk 80 in the exemplary embodiment shown is fixed by means of three projections 29, wherein the three projections 29 not only fix the adjustment disk 80 in the direction of rotation of the control push rod 65, but also positively fix this in the axial direction of the control push rod in that the individual projections 29 are reshaped from their initial state by the effect of heat, as shown by means of the dotted line in FIG. 7, so that they partially engage over the adjustment disk 80. After adjusting the switching stroke and reshaping the projections 29, the positioning of the adjustment disk 80 cannot normally change. However, notwithstanding this, in order to enable a readjustment to be carried out under certain circumstances, a screw-in projection 30 with an integral tapped hole 31 for a locking screw 82 is molded in each case onto the side of each tubular piece 26 as an additional embodiment. The adjustment disk 80 can then be adjusted by means of the locking screw 82 even when the protruding part of the projections 29 has been removed.

Figure 3:
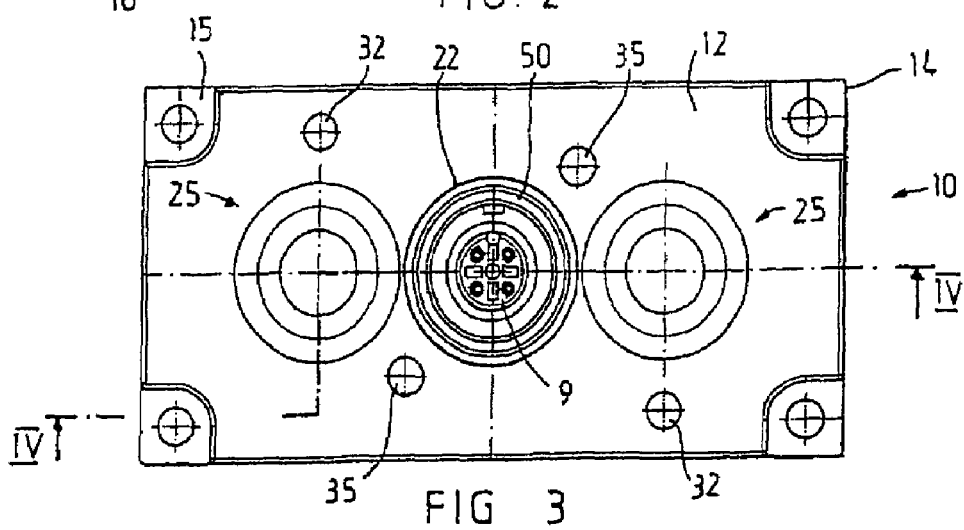
FIG. 3 shows a plan view on the housing cover of FIG. 2.

As FIG. 3 particularly shows, the top side 12 of the housing cover 10 is also provided with two filling openings 32 for potting compound, wherein, if necessary when filling with potting compound, one of the two filling openings 32 only forms a ventilation opening. Furthermore, two fiber-optic rods 35 are anchored in the top side 12 in such a way that they lie free at the top side 12 with their one, preferably lenticular end, and extend down to the printed circuit board 8 with their other ends. The signals from LEDs (not shown), which are arranged on the printed circuit board 8 for this purpose, can be passed on by means of the fiber-optic rods to the top side 12 and be displayed there so that during operation it can be seen from the outside on the top side 12 of the housing cover 10 which operating state the individual solenoids are in.

For the person skilled in the art, numerous modifications arise from the above description, which are intended to fall within the area of protection of the attached claims. It is understood that the size of the set-back section of the boundary edges relative to the bottomsides of the sidewalls as well as the geometry of the mounting feet and the geometry of the tubular spigots can be varied within limits in order to continue to achieve a pre-determined clamping of a sealing plate without causing excessive compression. Neither is the invention restricted to the threaded bush and the contact plug shown in the figures, but different threaded bushes and contact plugs can be associated with a housing cover with identical construction.

The invention claimed is:

1. A housing cover for a solenoid housing operable for accommodating solenoids for switching hydraulic directional valves, the housing cover comprising:
    a housing cover box, the housing cover box including a plurality of side walls, a top side connected to the plurality of side walls, and an open bottom side, an interior of the housing cover box being operable for containing a printed circuit board;
    a first control push rod actuating guide and a second control push rod actuating guide each located on the top side of the housing cover box;
    a first solenoid control push rod and a second solenoid control push rod;
    a plug connector located between the first and second actuating guides;
    a plurality of screw clearance holes, at least one of the plurality of screw clearance holes being located at a corner of the housing cover box and each screw clearance hole being operable for locating a screw for joining the housing cover box to the solenoid housing;
    a sealing plate located between the housing cover box and the solenoid housing;
    a plurality of mounting feet, at least one of the plurality of mounting feet being located at a corner of the housing cover box and on a bottom surface of the housing cover box; and a plurality of tubular spigots, at least one of the plurality of tubular spigots being aligned with and extending each respective screw clearance hole, wherein portions of the bottom surface of the housing cover box located between the plurality of tubular spigots include set-back boundary edges of at least one of the plurality of side walls, the set-back boundary edges of the at least one of the plurality of side walls being operable as clamping edges for the sealing plate; and the first control push rod actuating guide and the second control push rod actuating guide are operable for manual operation of the first and second solenoid control push rods, respectively.

2. The housing cover of claim 1, further comprising at least one circumferential peripheral sealing rib located a predetermined distance from the plurality of mounting feet and located on at least one of the setback boundary edges.

3. The housing cover of claim 1, further comprising:
a threaded bush including an anchoring section;
a double-walled mounting piece located on the top side of the housing cover box, the double-walled mounting piece including an annular gap operable for anchoring the anchoring section of the threaded bush; and
a ring-shaped collar connected to a rear side of a bottom of the double-walled mounting piece.

4. The housing cover of claim 3, wherein
the anchoring section of the threaded bush is cast into the top side of the housing cover box.

5. The housing cover of claim 1, further comprising at least one adjustment disk operable for adjusting a control push rod switching stroke, the at least one adjustment disk being arranged in at least one of the first control push rod actuating guide and the second control push rod actuating guide, wherein
the at least one adjustment disk is accessible from the top side.

6. The housing cover of claim 5, further comprising:
at least one projection located on the top side of the housing cover box; and
at least one locking recess located in the at least one adjustment disk, wherein
the at least one projection engages the at least one locking recess.

7. The housing cover of claim 6, wherein
a length of the projection is initially greater than a thickness of the adjustment disk; and
the projection is operable for forming one of a positive or bonded fixing of the adjustment disk by reshaping the projection through an application of heat.

8. The housing cover of claim 1, further comprising:
a first ring-shaped extension and a second ring-shaped extension, each of the first and second ring-shaped extensions being located on the top side of the housing cover box and on a respective one of the first and second control push rod actuating guides;
first and second circumferential peripheral indentations each located on a respective one of the first and second ring-shaped extensions; and
first and second elastic hoods, wherein
the first and second peripheral indentations are each operable for anchoring a respective one of the first and second elastic hoods.

9. The housing cover of claim 8, further comprising a plurality of tapped holes each operable for locating a locking screw, wherein
at least one of the plurality of tapped holes is located in a bottom of one of the first control push rod actuating guide and the second control push rod actuating guide and within the respective first ring-shaped extension and second ring-shaped extension.

10. The housing cover of claim 9, further comprising a first cast-on tubular piece and a second cast-on tubular piece located on a respective one of the first control push rod actuating guide and the second control push rod actuating guide, wherein
each of the first and second cast-on tubular pieces extend from the top side of the housing cover box to the bottom surface of the housing cover box.

11. The housing cover of claim 10, wherein
each of the plurality of tapped holes is cast on a side of one of the first and second cast-on tubular pieces.

12. The housing cover of claim 1, further comprising a plurality of filling openings located on the top side of the housing cover box, wherein
each of the plurality of filling openings is operable for receiving a potting compound.

13. The housing cover of claim 1, further comprising at least one fiber-optic rod attached to the top side of the housing cover box, wherein
a first end of the at least one fiber-optic rod is free at the top side of the housing cover box; and
a second end of the fiber-optic rod extends to a printed circuit board position in the interior of the housing cover box.

14. The housing cover of claim 13, wherein
the at least one fiber-optic rod includes a first fiber-optic rod and a second fiber-optic rod; and
each of the first fiber-optic rod and a second fiber-optic rod are operable for independently transmitting light from a respective light-emitting diode on a circuit board to indicate a solenoid switching state.

* * * * *